United States Patent
Kitai et al.

(10) Patent No.: US 6,462,306 B1
(45) Date of Patent: Oct. 8, 2002

(54) SYSTEM AND METHOD FOR MATERIAL PROCESSING USING MULTIPLE LASER BEAMS

(75) Inventors: Anton Theodore Kitai, Ottawa; Ian James Miller, Gloucester; Steven Harold Moffat, Carleton Place, all of (CA)

(73) Assignee: GSI Lumonics, Inc., Kanata (CA)

( * ) Notice: Subject to any disclaimer, the term of this patent is extended or adjusted under 35 U.S.C. 154(b) by 0 days.

(21) Appl. No.: 09/558,368

(22) Filed: Apr. 26, 2000

Related U.S. Application Data

(60) Provisional application No. 60/131,139, filed on Apr. 27, 1999.

(51) Int. Cl.[7] .................. B23K 26/067; B23K 26/06
(52) U.S. Cl. .................. 219/121.77; 219/121.76; 219/121.7; 219/121.78; 359/301; 359/618
(58) Field of Search .................. 219/121.76, 121.77, 219/121.7, 121.78; 359/223, 301, 618, 662, 754

(56) References Cited

U.S. PATENT DOCUMENTS

| | | | |
|---|---|---|---|
| 4,502,762 A | * | 3/1985 | Anderson |
| 4,789,770 A | | 12/1988 | Kasner et al. |
| 4,947,023 A | | 8/1990 | Minamida et al. |
| 4,950,862 A | * | 8/1990 | Kajikawa |

(List continued on next page.)

FOREIGN PATENT DOCUMENTS

| | | |
|---|---|---|
| EP | 0 299 702 A1 | 1/1989 |
| EP | 0 884 128 A1 | 12/1998 |
| EP | 1 095 726 A1 | 5/2001 |
| JP | 08141769 | 6/1996 |
| JP | 11058055 | 3/1999 |

OTHER PUBLICATIONS

Mark Owen, Electro Scientific Industries, Inc., "Eliminating X–Ray Alignment, Desmear, and Electroless Copper Process Steps Using UV YAG Laser Drilled Microvias", IPC Printed Circuits Expo 1997, Mar. 9–13, 1997, San Jose, California, pp. S15–1 to S15–1–6.

M. Owen, E. Roelants and J. Van Puymbroeck, "Laser drilling of blind holes in FR4/glass", Circuit World 24/1 (1997), pp. 45–49.

Primary Examiner—Tom Dunn
Assistant Examiner—Colleen P. Cooke
(74) Attorney, Agent, or Firm—Hoffman, Warnick & D'Alessandro LLC; John A. Merecki

(57) ABSTRACT

A material machining system for machining a workpiece (PCB, PWB etc.) for drilling blind vias. The system includes a laser supply system (20, 26, 30) for supplying discrete machining beams (22a, 22b) that are separate from each other. A deflecting devices (28, 32) is provided for deflecting each of the discrete machining beams to generate multiple independent beams at a plurality of positions within a field of operation on the workpiece. A scan lens (34) having an entrance pupil configured to receive the multiple independent beams from the deflecting devices is provided proximate to the entrance pupil of the scan lens. A computer is used for controlling the deflecting devices to change the respective positions of the multiple independent beams in at least one co-ordinate direction within the field of operation. The deflecting devices include galvo/mirror pairs at the entrance pupil of the scan lens. This is accomplished since the scan lens has a relatively large entrance pupil and the mirror parts are small. The advantage of this arrangement is the ability of all beams to access a full working field (typically 2×2 inches) on the workpiece simultaneously, so that the highest efficiency of laser power utilization is achieved.

36 Claims, 11 Drawing Sheets

U.S. PATENT DOCUMENTS

| | | | |
|---|---|---|---|
| 5,024,968 A | * | 6/1991 | Engelsberg |
| 5,063,280 A | | 11/1991 | Inagawa et al. |
| 5,126,532 A | | 6/1992 | Inagawa et al. |
| 5,168,454 A | * | 12/1992 | LaPlante et al. |
| 5,290,992 A | * | 3/1994 | Lin et al. |
| 5,293,025 A | | 3/1994 | Wang |
| 5,296,673 A | * | 3/1994 | Smith |
| 5,378,869 A | | 1/1995 | Marrs et al. |
| 5,404,247 A | * | 4/1995 | Cobb et al. |
| 5,408,553 A | * | 4/1995 | English, Jr. et al. |
| 5,670,068 A | | 9/1997 | Kuriyama et al. |
| 5,676,866 A | | 10/1997 | in den Bäumen et al. |
| 5,948,288 A | * | 9/1999 | Treves et al. |
| 5,969,877 A | * | 10/1999 | Maeda |
| 6,037,968 A | * | 3/2000 | Emge et al. |
| 6,233,044 B1 | * | 5/2001 | Brueck et al. |

* cited by examiner

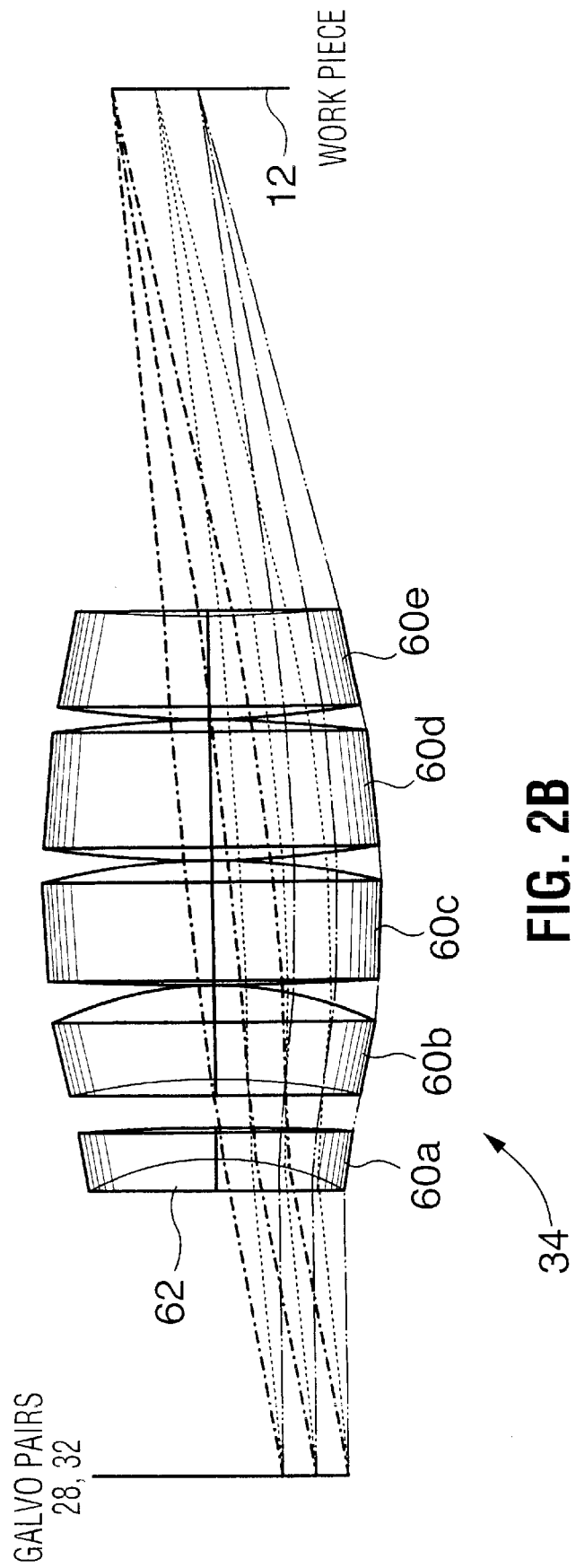

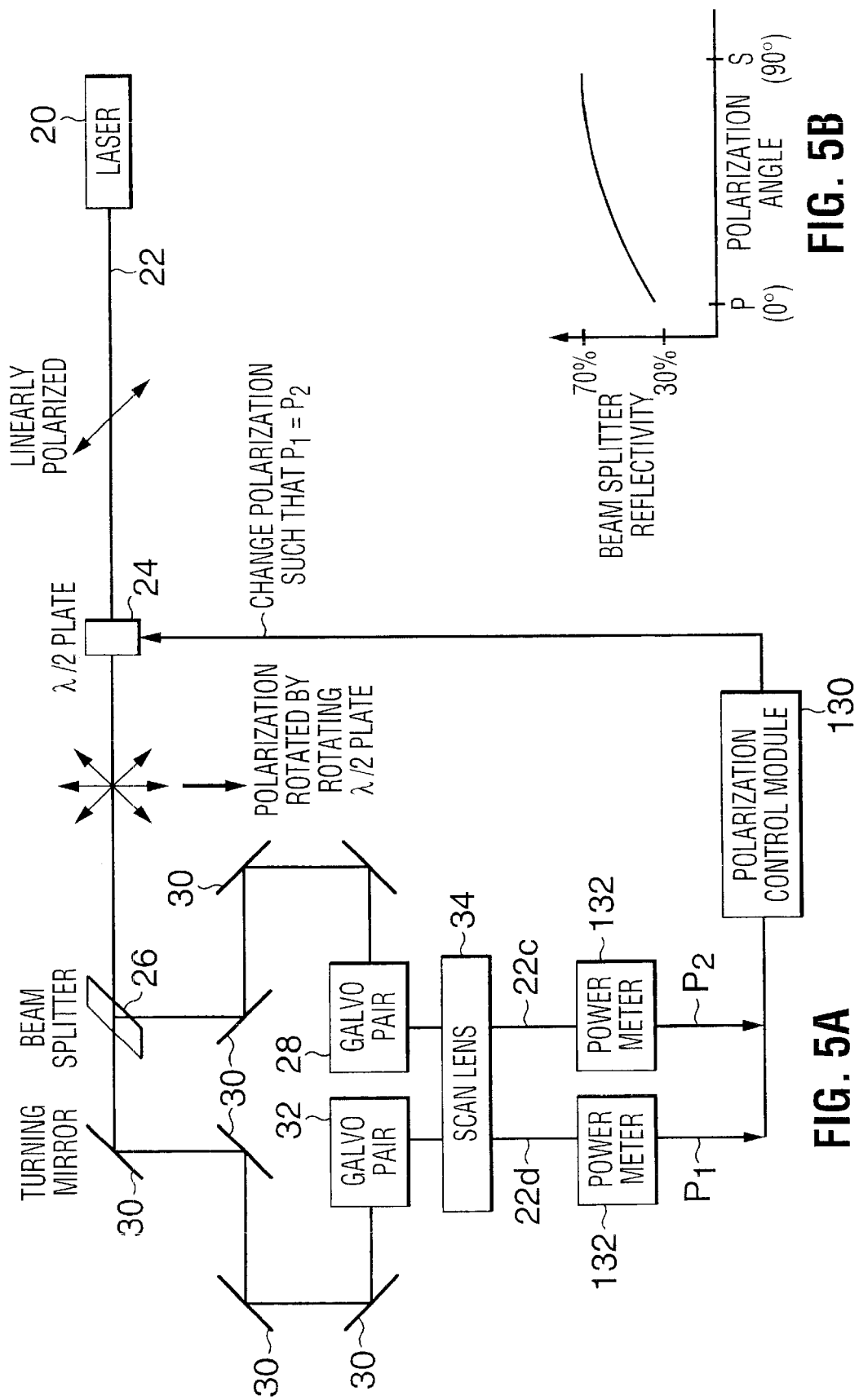

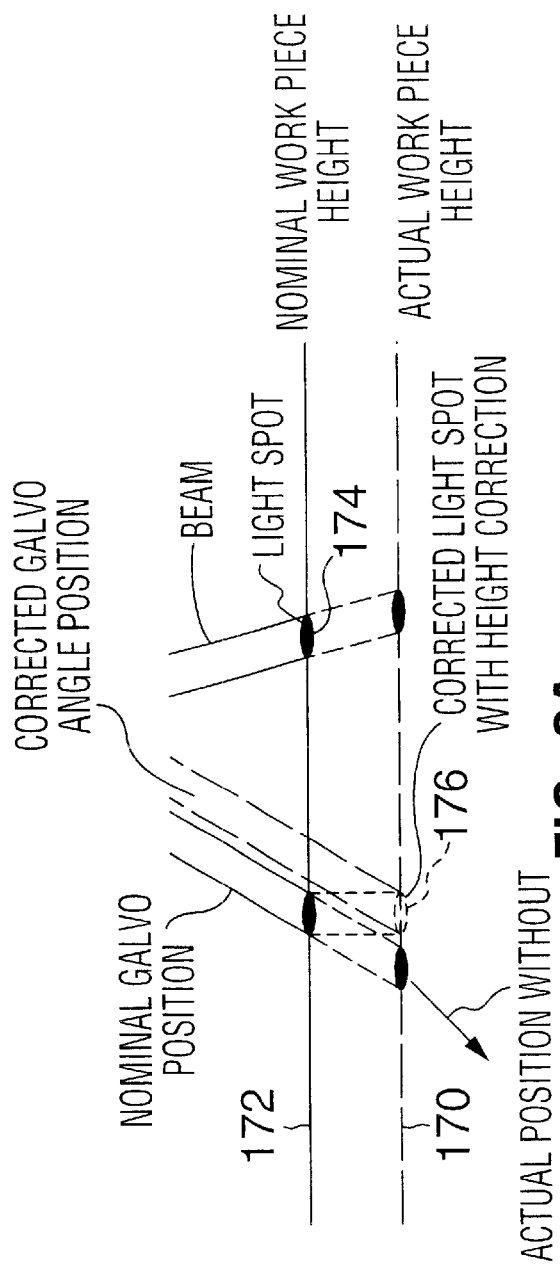
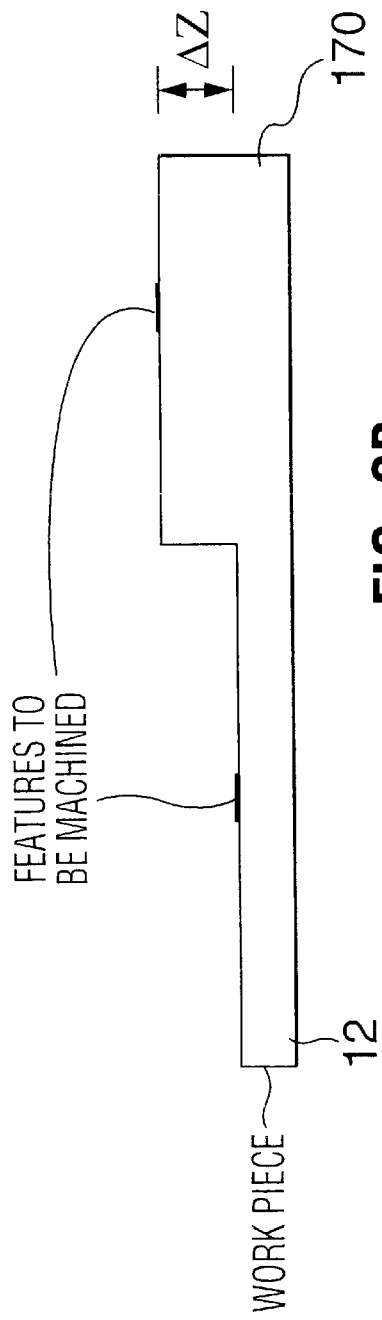
FIG. 9A
FIG. 9B

SYSTEM AND METHOD FOR MATERIAL PROCESSING USING MULTIPLE LASER BEAMS

CROSS-REFERENCE TO RELATED APPLICATIONS

This application claims the benefit of U.S. Provisional Application No. 60/131,139 filed Apr. 27, 1999.

FIELD OF THE INVENTION

This invention relates to the field of material processing using laser beams.

BACKGROUND OF THE INVENTION

Material machining of electronic components (printed circuit boards-PCB, printed wire boards-PWB etc.) using laser beams is used to generate fine holes in flexible and hard materials. The density requirements of electronic components is increasing at a rapid rate and utilization of real estate (on a PWB or PCB) is also increasing. Small through holes are very costly to produce, which has reduced acceptance in the industry. Blind holes or vias (i.e. holes that do not pass completely through a multi-layered printed wiring board) make more efficient use of PWB real estate, but are expensive to produce.

U.S. Pat. No. 5,676,866 issued on Oct. 14, 1997 discloses a laser beam drilling process. The laser beam is spatially divided into many beams each of which hits a mirror element and is directed down onto the workpiece through a single focusing lens. A particular mirror element cannot direct a laser beam to all portions of the lens field area because the lens acts as a physical aperture to block some beam paths to the lens field.

The beams do not move during the actual drilling process (i.e. it is a percussion process not a trepanning process). U.S. Pat. No. 5,676,866 teaches the division of a large area beam into a large number of beamlets to do simultaneous processing of all the elements in one field, then move the sample to the next field.

This is a common scheme to utilize the beam from a laser with a high pulse energy efficiently in order to machine many holes in parallel where the energy to drill each hole is small.

SUMMARY OF THE INVENTION

An object of the present invention is to provide an apparatus for focusing multiple laser beams through a single scan lens.

Another object of the present invention is to provide a method of passing multiple differing beams through a single lens.

Another object of the present invention is to provide a method of passing multiple beams through a number of different lenses to provide parallel processing support.

Another object of the present invention is to provide a method of beam splitting and energy balancing to create multiple beams.

Another object of the present invention is to provide a method of beam shuttering using beam positioning galvanometers.

Another object of the present invention is to provide a multi-beam imaging system using path length balancing.

Another object of the present invention is to provide a method of alternating beams from different angles to improve feature quality.

Another object of the present invention is to provide a method of compensation for workpiece thickness variations to correct for beam position errors resulting from beam angle.

In accordance with one aspect of the present invention there is provided a material machining apparatus for machining a workpiece, said apparatus comprising: supply means for supplying a plurality of discrete machining beams that are separate from each other; deflecting devices, one for each of the plurality of discrete machining beams, for deflecting one of the plurality of discrete machining beams to generate multiple independent beams at a plurality of positions within a field of operation on the workpiece; a scan lens having an entrance pupil, said entrance pupil being configured to receive the multiple independent beams from the deflecting devices, said deflecting devices being located proximate to the entrance pupil of the scan lens; and control means for controlling said deflecting devices to change the respective positions of the multiple independent beams in at least one co-ordinate direction within the field of operation.

In accordance with another aspect of the present invention there is provided a material processing apparatus for machining a workpiece using a first laser source operating at a wavelength $\lambda_1$ generating a first source beam and a second laser source operating at a wavelength $\lambda_2$ generating a second source beam, said apparatus comprising: means for angularly dividing each of the first and second source beams to generate a plurality of beamlets associated with each of the first and second source beams whereby each beamlet approximately matches the respective source beam at a lower intensity; means for focusing the beamlets of each of the first and second source beams; and means for separately controlling each focused beamlet of each of the first and second source beams to scan the focused beamlets with a via being drilled in the workpiece, whereby when one of the beamlets is completed processing at a first position it can move to another position. In accordance with another aspect of the present invention there is provided a material machining apparatus for machining a workpiece, said apparatus comprising: supply means for supplying a plurality of discrete machining beams that are separate from each other; deflecting devices, one for each of the plurality of discrete machining beams, for deflecting one of the plurality of discrete machining beams to generate multiple independent beams at a plurality of positions within a field of operation on the workpiece; a plurality of scan lenses each having an entrance pupil, the plurality of discrete machining beams each being directed through the plurality of scan lenses each with said deflecting devices proximate to the entrance pupil of a respective one of the plurality of scan lenses; and control means for controlling said deflecting devices to change the respective positions of the multiple independent beams in at least one co-ordinate direction within the field of operation.

In accordance with another aspect of the present invention there is provided a method of machining a workpiece using a laser comprising the steps of (a) supplying a plurality of discrete machining beams that are separate from each other generated from the laser; (b) deflecting each one of the plurality of discrete machining beams to generate multiple independent beams at a plurality of positions within a field of operation on the workpiece; (c) receiving and outputting the multiple independent beams received at an entrance pupil of a scan lens; and (d) changing the respective positions of the multiple independent beams in at least one co-ordinate direction within the field of operation.

In accordance with another aspect of the present invention there is provided a method of drilling a via in a workpiece using a first laser beam and a second laser beam where the first laser beam and the second laser beam converge at the workpiece at an incident angle, said method comprising alternatingly pulsing the first laser beam and the second laser beam until the via is formed on the workpiece.

BRIEF DESCRIPTION OF THE DRAWINGS

The present invention will be described in conjunction with the drawings in which:

FIG. 2B shows a schematic representation of the scan lens shown in FIG. 1;

FIG. 5A shows a schematic representation of a power balancing apparatus used in conjunction with the apparatus of FIG. 1 according to another embodiment of the present invention;

FIG. 5B is a typical representation of beam splitter reflectivity versus polarization angle;

FIG. 9A shows a detailed schematic of the operation of the workpiece height sensor shown in FIG. 1; and FIG. 9B illustrates a side elevation view of workpiece with multiple levels.

DETAILED DESCRIPTION OF EMBODIMENTS OF THE INVENTION

Figure 1A:
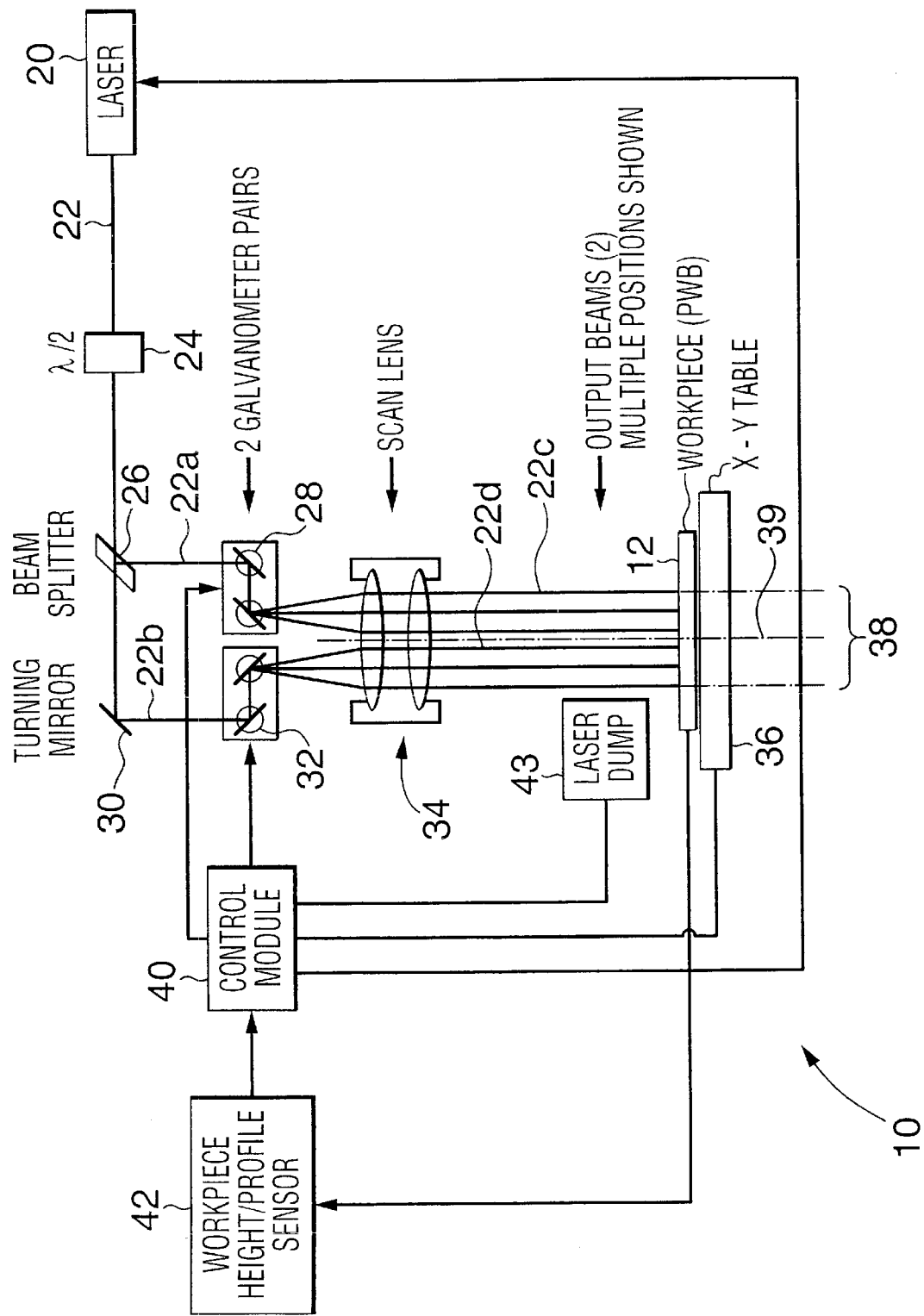
FIG. 1A shows a schematic representation of a material processing apparatus using one scan lens according to an embodiment of the present invention.

FIG. 1A illustrates a material processing apparatus 10 according to an embodiment of the present invention. The apparatus 10 is used to drill blind vias in multi-layered laminated printed circuit/wire boards (PCB, PWB) in the electronics industry.

Figure 1B:
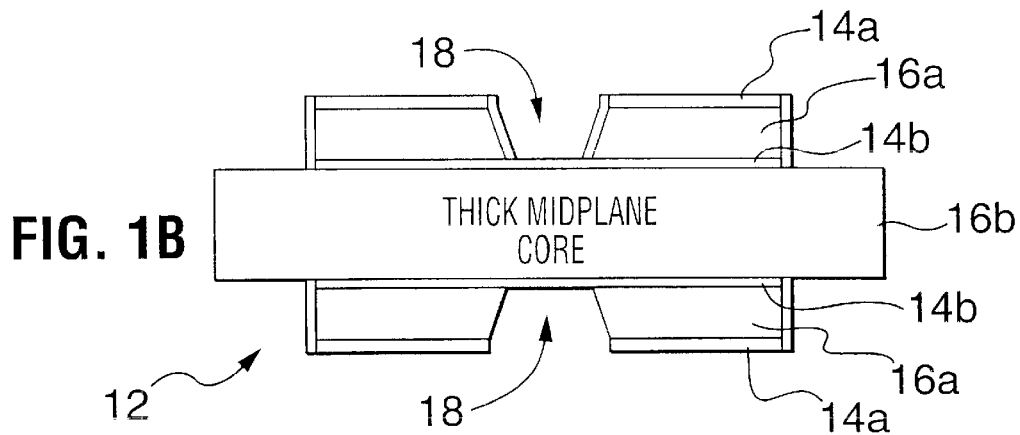
FIG. 1B shows a cross-sectional side elevation view of a multi-layered printed wire board drilled with a blind via using the apparatus of FIG. 1.

A typical multi-layered printed circuit board (PCB) 12, shown in FIG. 1B, consists of multiple alternating layers of metal, typically copper, 14a,b and dielectric 16a,b where the dielectric is typically epoxy, epoxy impregnated with fillers such as glass fibers, teflon, polyimide, BT or other choices of suitable dielectric material. The layers 14 and 16 are pressed together and temperature cured, i.e. there is typically no glue layer. A blind via drilling process makes vias 18 through the upper copper 14a and the first layer of dielectric 16a, stopping at the second (blind) copper layer 14b. The same process is usually done on the opposite side of the board by flipping the board over, but the thick middle layer 16b is not drilled through. Subsequent processing steps include cleaning of the drilled via 18 and plated with metal (solder) through from the upper copper layer 14a to the second copper layer 14b.

Referring to FIG. 1A, the apparatus 10 includes a source laser 20 (operating at ultraviolet UV, visible, or infrared IR, for example) to generate a single laser beam 22. The beam 22 is passed through a polarization rotator or filter 24 (generically referred to as a polarization modifier), for example a $\lambda/2$ plate, to a beam splitter 26 to split the beam 22 into two components 22a and 22b. Beam 22a passes from the beam splitter 26 to a first galvanometer (galvo) pair 28 and the beam 22b passes through the beam splitter 26 to a turning mirror 30 to a second galvanometer pair 32.

Each galvo pair 28 and 32 direct the respective beam 22a and 22b through a scan lens 34 to produce a pair of output beams 22c,d used to drill the vias 18 in the workpiece 12 that is mounted on a standard X-Y table 36, which moves using industry known servos and the like. Note that only two output beams 22c,d are produced through the scan lens 34, multiple positions of the beams 22c,d are shown in FIG. 1 to illustrate the range of lasing coverage within an operating field 38.

The apparatus 10 also includes a control module 40 connected to (a) the X-Y table 36 to control movement of the workpiece 12 mounted thereon, (b) the laser 20 to control lasing, (c) the galvo pairs 28 and 32 to control beam 22c,d position within the field 38; (d) to a workpiece height/profile sensor 42 that monitors height/profile changes in the workpiece 12 during drilling to control the galvos 28 and 32 to make appropriate adjustments in output beam 22c, 22d angles; and (e) a laser dump 43 used to dump or re-direct unwanted output beams 22c,d from the workpiece 12.

Figure 2A:
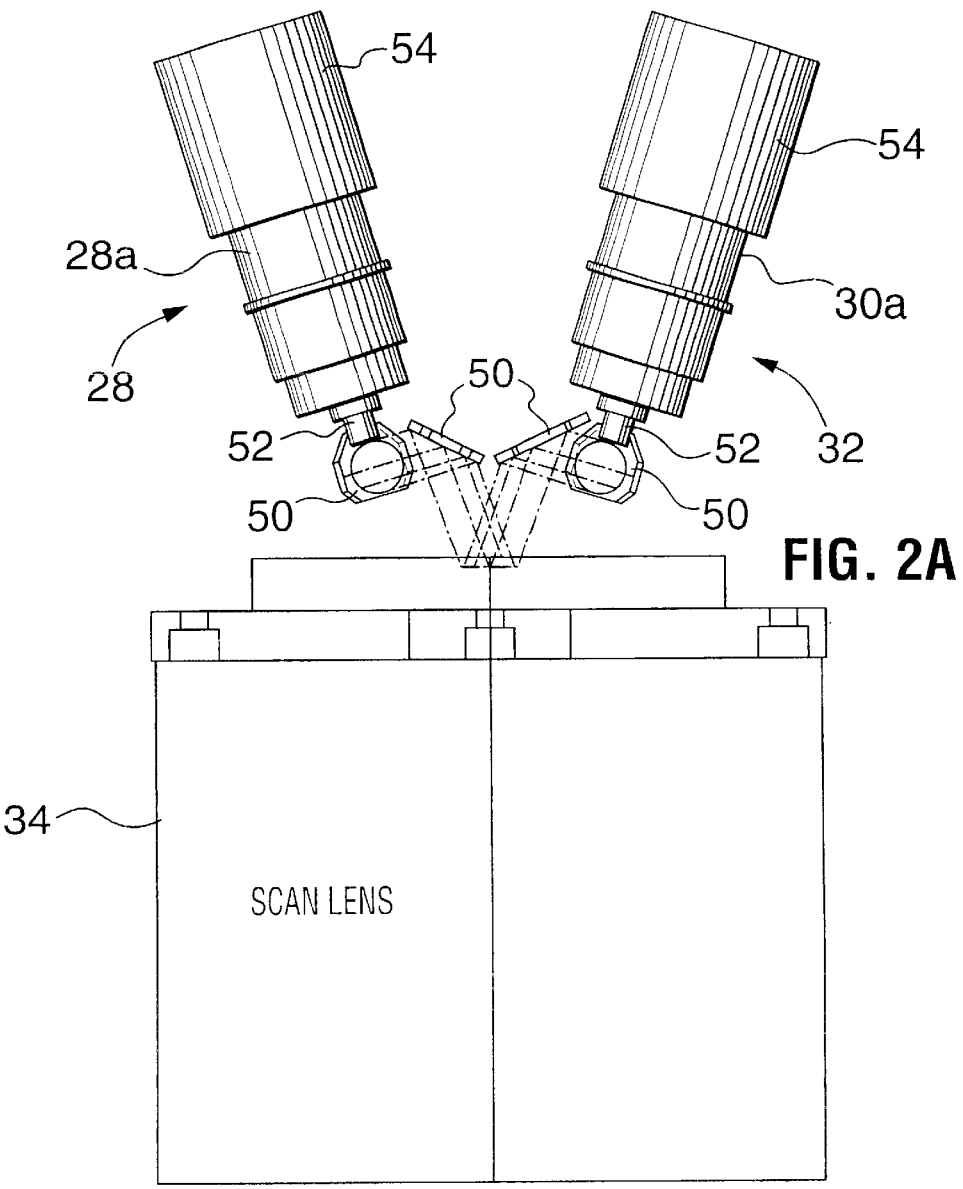
FIG. 2A shows a schematic representation of the galvanometers shown in FIG. 1 according to the present invention.

A detailed schematic of the two galvo pairs 28, 32 is shown in FIG. 2A. Each galvo pair 28, 32 consists of two separate galvanometers. Only one galvanometer 28a, 32a from each pair is shown in FIG. 2A for simplicity. Each galvanometer 28a, 32a includes a mirror 50 mounted to a moving element 52, such as a rotating armature or moving magnet, with drive coils 54 and an angular feedback circuit in a closed loop servo arrangement such that the angle of the mirror is precisely controlled in accordance with a commanded input signal.

The galvanometers 28a and 32a are controlled by control module 40 to adjust the angle of the beams 22a, b forward of the scan lens 34 in one or more planes. The scan lens 34 is designed such that the focus of each beam 22c, d lies as close as possible to the field 38 located at the workpiece 12 and independent of the angle of the beam 22c, d relative to an axis 39 of the scan lens 34.

Furthermore, the scan lens 34 is designed such that the angle of the beams propagating before of the scan lens 34 is converted to a displacement in one or more axes at the workpiece 12 after the scan lens 34.

A detailed schematic of the scan lens 34 is shown in FIG. 2B. The scan lens 34 is comprised of a series of individual lenses 60a–e. The scan lens 34 is designed with an entrance pupil 62 to accept multiple beams from multiple separate galvos 28, 32 located behind the scan lens 34 and located at, or as close as possible to, the plane of the entrance pupil 62 of the scan lens 34.

The scan lens 34 enables all beams (generated from the galvos 28, 32) to access the full field 38 simultaneously, so that the highest possible efficiency of laser power utilization is achieved.

In summary, the galvanometer pairs 28, 32 each direct one beam 22a, 22b through a single scan lens 34. Multiple galvanometer pairs 28, 32 acting in different planes can be used to position an individual beam in several axes to create multi-dimensional processing fields on the workpiece 12. By combining a system of multiple beams 22a,b and multiple galvos 28,32 with a single scan lens 34, the processing field 38 can be simultaneously accessed over its entire area by multiple processing beams 22c,d. Among the benefits of being able to process multiple features in parallel through a single lens 34: (a) increased efficiency in parallel processing of random patterns and (b) lower cost in a single lens as opposed to multiple lenses.

Figure 3:
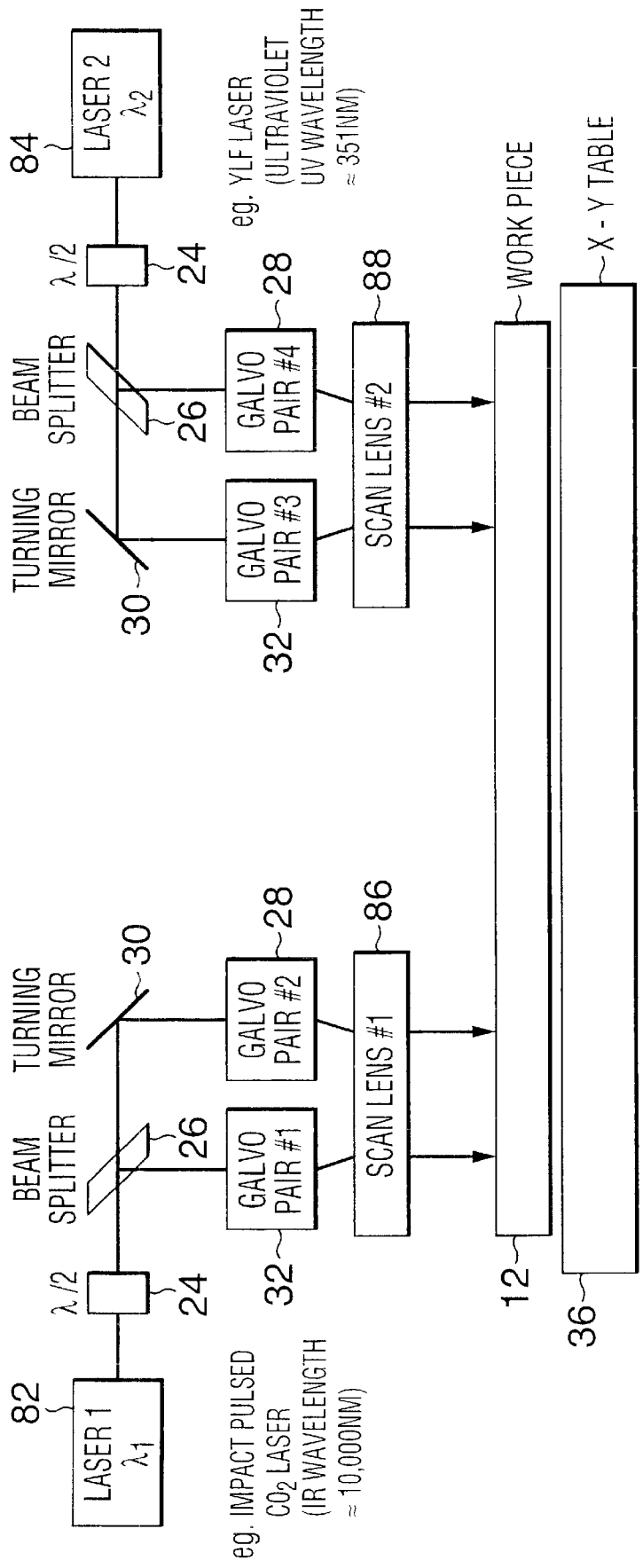
FIG. 3 shows a schematic representation of a material processing apparatus using two scan lenses according to another embodiment of the present invention.

For higher throughput, one or more scan lenses each processing multiple beams can be included in the apparatus 10 such that further parallel processing of the workpiece 12 can be achieved. A multi-scan lens system 80 is illustrated in FIG. 3. The system 80 includes a first laser source 82 operating at a wavelength $\lambda_1$, a second laser source 84 operating at a wavelength $\lambda_2$, a first scan lens 86 for receiving beams generated from laser 82, and a second scan lens 88 for receiving beams generated from laser 84.

The lasers 82 and 84 generate laser beams that are individually processed through elements 24, 26, 30, the galvos 28, 32 and the respective scan lens 86 and 88 as discussed in FIG. 1. The control module 40, the workpiece height/profile sensor 42 and the laser dump 43 are a part of the apparatus 80, but are not shown in FIG. 3 for simplicity.

As a further alternative, a single laser source can provide a laser beam that is split into sub-beams such that the sub-beams are used to process material using at least two lenses in a similar manner to that described above.

The apparatus 80 enables simultaneous processing by beams of differing wavelengths (i.e. where $\lambda_1 \neq \lambda_2$) as well as differing spatial and temporal profiles. The advantage is the capability to perform differing processes in parallel on a single workpiece 12 and to perform sequential processes with a high time overlap efficiency.

Figure 4A:
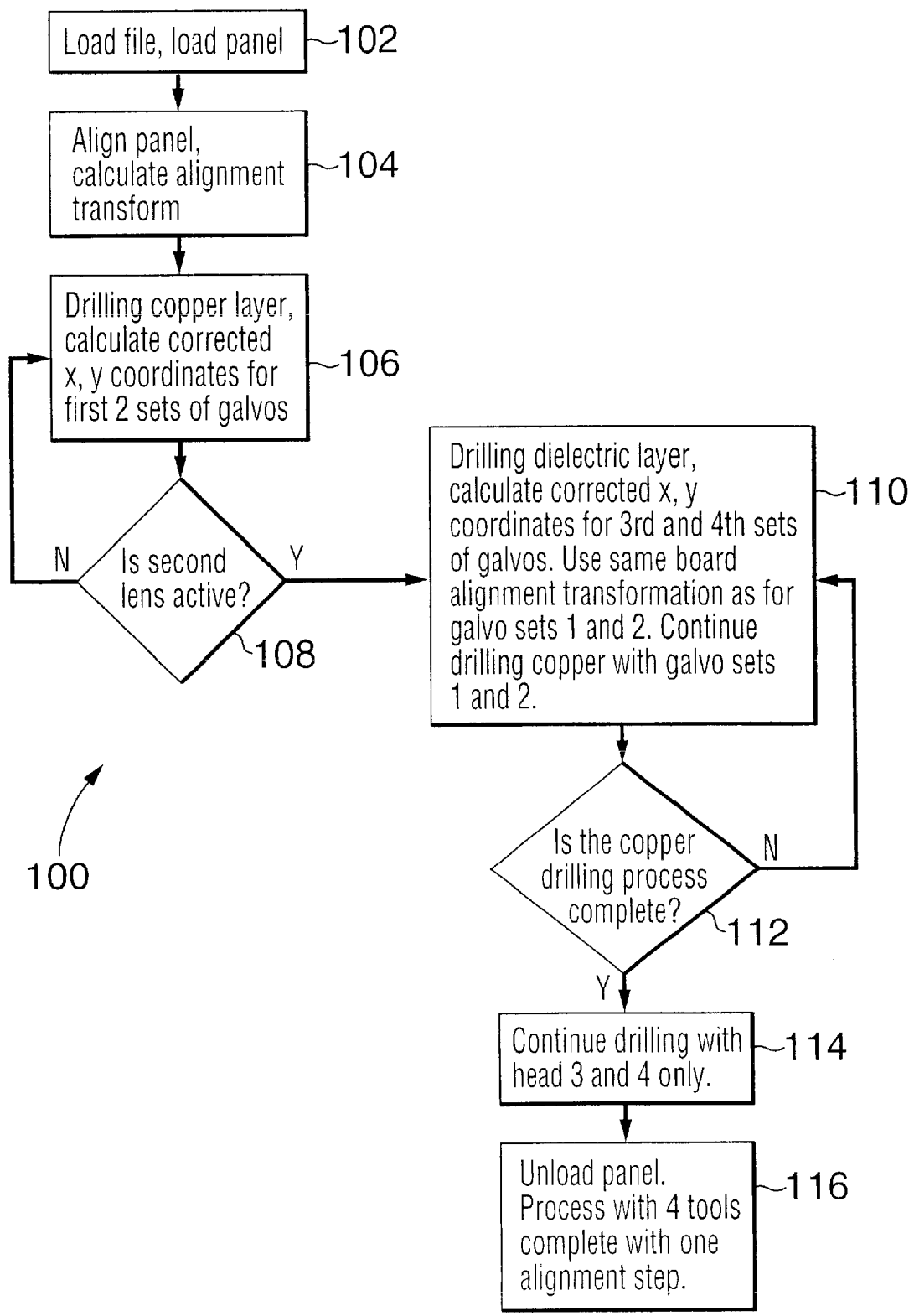
FIGS. 4A and 4B show a flow chart and a process diagram illustrating the steps of material processing using multiple beams.
Figure 4B:
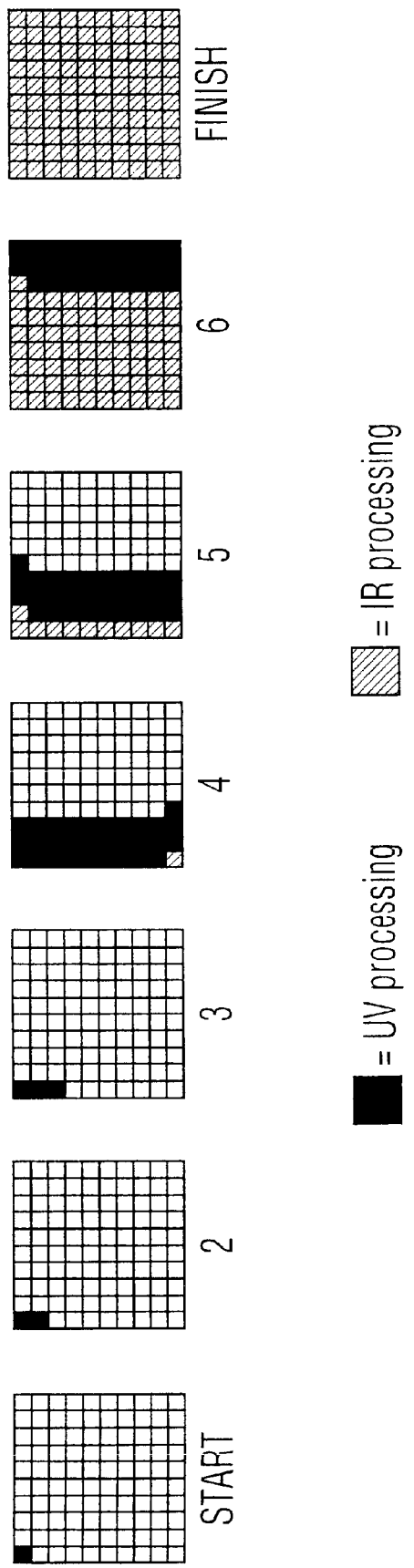

A method of processing to simultaneously control multiple beams processing multiple features at the same time is illustrated in the flow chart of FIG. 4A and the process schematic of FIG. 4B.

In general, processing coordinates are typically provided to the system 80 in the form of a sequential list or table, which contains only a single reference to a feature. An example of this is a database of XY coordinates in appropriate measurement units that indicate centre locations of holes to be drilled on the workpiece 12 (PWB or PCB).

In order to facilitate processing multiple features in parallel, an array of pointers is initialized within a memory architecture in the control module 40 employing multiple processing threads. Coordinate data is passed to parallel buffers that are accessed to send coordinated galvanometer movement steps and laser triggering at precise timing intervals. This technique facilitates dynamic assigning of processing tasks to the same feature using multiple beams. An example of this is the sequential processing of layers of dissimilar materials such as copper clad PWB dielectric laminates using lasers of differing wavelength each suited to a particular material or process. The benefit is that sequential processes may take place in parallel with other sequential processes at multiple feature locations, resulting in efficient time overlap of process tasks.

Referring particularly to FIG. 4A, a process 100 to simultaneously control multiple beams processing multiple features begins by loading a coordinate file in the control module 40 and by loading a workpiece (or panel) 12 on the table 36 at step 102. The workpiece 12 is aligned and an alignment transformation is calculated at step 104 using techniques known in the field of the invention.

The copper layer 14a is drilled and corrected x,y coordinates for the $1^{st}$ and $2^{nd}$ galvo pairs (associated with scan lens 86—see FIG. 3) are calculated at step 106. If a second scan lens 88 is active, as determined at step 108 processing passes to step 110. If the second scan lens 88 is not active processing returns to step 106. At step 110 the dielectric layer 16a is drilled and corrected x,y coordinates for $3^{rd}$ and $4^{th}$ galvo pairs (associated with scan lens 88—see FIG. 3) are calculated. The same board alignment transformation as for the $1^{st}$ and $2^{nd}$ galvo sets are used and the copper continues to be drilled with the $1^{st}$ and $2^{nd}$ galvo sets.

If the copper drilling process is complete, as determined at step 112, then processing passed to step 114. If the copper drilling process is not complete then processing returns to step 110. At step 114 drilling continues with the $3^{rd}$ and $4^{th}$ galvo sets only. Once complete, processing passes to step 116 where the workpiece 12 is unloaded. Processing has therefore been accomplished using four tools ($1^{st}$–$4^{th}$ galvo sets) with only one alignment step 104.

A specific process example is provided in FIG. 4B. For the purpose of illustration an example of typical laser operating parameters are:

| Laser 82: | IR laser | |
| --- | --- | --- |
| | - pulse energy | 100 milliJoules |
| | - average power | 50 watts |
| | - pulse length | 1000 nanoseconds |
| | - repetition rate | 500 pulses per second |
| | - spot size focused on dielectric | 400 µm diameter |
| Laser 84: | UV laser | |
| | - pulse energy | 0.5 milliJoules |
| | - average power | 3 watts |
| | - pulse length | 100 nanoseconds |
| | - repetition rate | 6000 pulses per second |
| | - spot size focused on copper | 25 µm diameter |

Since the four galvo pairs (1–4 in FIG. 3) are fixed to a main frame and fixed relative to each other, the process begins from the left side of the workpiece 12 with UV processing only (lightly shaded blocks). The workpiece 12 on the X-Y table 36 is moved by the X-Y table 36 to address 2×2 inch areas (fields 39) of the workpiece 12 in series. Typically, the process involves the following steps: move the X-Y table 36 to a location (0,0)-START under the two UV galvos ($3^{rd}$ and $4^{th}$ pair); the UV galvos drill holes in the copper layer 14a; the X-Y table 36 moves to a location (0,2)-position 2 under the two UV galvos; the UV galvos drill holes in the copper layer 14a; the X-Y table 36 moves to a location (0,4)-position 3 under the two UV galvos; and continues through the entire workpiece 12.

After the UV galvos have processed the first three 2 inch wide columns, then the IR galvos ($1^{st}$ and $2^{nd}$ pair) are in a position to address the first column (position 4 in FIG. 4B) while the UV galvos address the forth column. At this time, both lasers 82, 84 process vias 18 in parallel with the UV laser 84 drilling copper holes at column 4 while the IR laser 82 remove dielectric from the copper holes at column 1 to form finished vias 18 in column 1.

The X-Y table 36 continues to move the workpiece 12 in 2 inch steps in a step-by-step process until the UV galvos are no longer above the workpiece 12 on the right side-position 6. The last three columns on the right side are processed by the IR galvos with the UV galvos idle until vias 18 are all done-position FINISH. For a two-sided board, after the first side is finished the workpiece 12 is removed, flipped over and replaced on the X-Y table 36 for processing.

FIG. 5A shows a schematic representation of a power balancing apparatus used in conjunction with the apparatus 10 of FIG. 1. In the apparatus 10, individual beams are created by splitting the output of the single laser source 20 into two or more beams. The splitting can be accomplished using a scheme whereby spatial components of a beam are separated by means of reflective or refractive optics as discussed previously. The splitting can also be accomplished using partially reflective or transmissive optics that divide the energy in the beam into separate beams. An example of this would be a partially reflective multi-layer dielectric coating. In either case, the relative energy contained in each of the split beams could be adjusted by design of the beam splitter.

For the case where the splitting ratio of the beam splitter is dependent on beam polarization, the relative energy contained in the split beams are adjusted by means of the polarization rotator 24 located in the path of the input beam 22. The purpose of the adjustment is to define the energy density of the beams at the workpiece 12. The polarization rotator 24 may be fixed or adjustable and may be automatically controlled, if desired, using a polarization control module 130 based on feedback from photo-detectors or power meters 132 that measure the energy $P_1$ and $P_2$ in each of the beams 22c,d outputted from the scan lens 34. This arrangement provides the ability to adjust the relative energy in the split beams and to compensate for the splitting ratio errors common to typical beam splitters.

For the case of polarized beams 22, the polarization rotator 24 (for example a half wave plate-$\lambda/2$) is inserted in the beam 22 prior to the beam splitter 26. Adjusting the angle of the laser polarization by adjusting the rotator 24 allows precise control of the reflectivity (see graph of FIG. 5B-beam splitter reflectivity versus polarization angle) of the beam splitter 26 independent of the precise construction and properties of the beam splitter 26.

Figure 6:
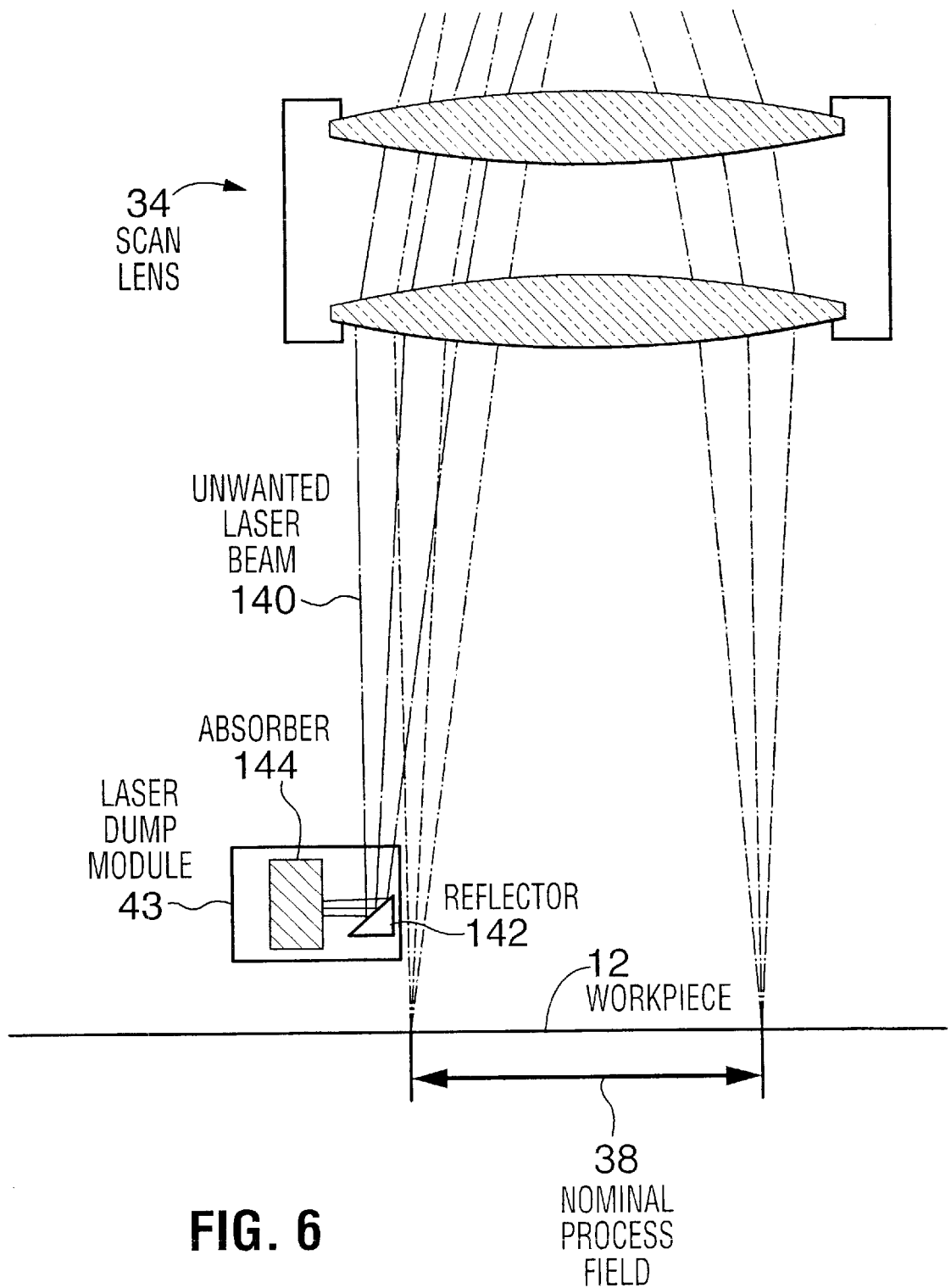
FIG. 6 shows a detailed schematic of the laser dump module shown in FIG. 1.

FIG. 6 illustrates an expanded schematic view of the laser dump 43 shown in FIG. 1. The dump 43 is a fast beam shuttering system using the beam positioning galvos 28, 32. The dump 43 is used to re-directed an unwanted laser beam 140 from the scan lens 34 so that it does not hit the workpiece 12. The dump 43 includes a reflector 142 and an absorber 144. The control module 40 controls the galvo pairs 28, 32 such that unwanted beam 140 is directed to the reflector 140 for ultimate redirection to the absorber 144.

In particular, in the case where multiple beams are split from the beam of a single laser source, it is often desirable to stop some but not all of the beams from reaching the processing field 38. Specifically, if the number of features to be processed is not an integral multiple of the number of split beams that are processing that field 38, undesirable extra processing in the field 38 would result in damage to the workpiece 12.

One or more beam block locations are provided just outside the nominal processing field 12 and positioned forward of the scan lens 34 such that extra beams that are not desired may be positioned at these locations using the galvanometers 28, 32. The absorber 144 is made from a material which can withstand the full intensity of the beam(s) without allowing significant energy to reach the workpiece 12. The beam dump 43 provides the following advantages: (a) savings in cost and complexity by using existing beam manipulation devices; (b) high speed of beam switching using fast galvanometers; and (c) power handling requirements make a moving shutter impractical for high speed switching.

Figure 7:
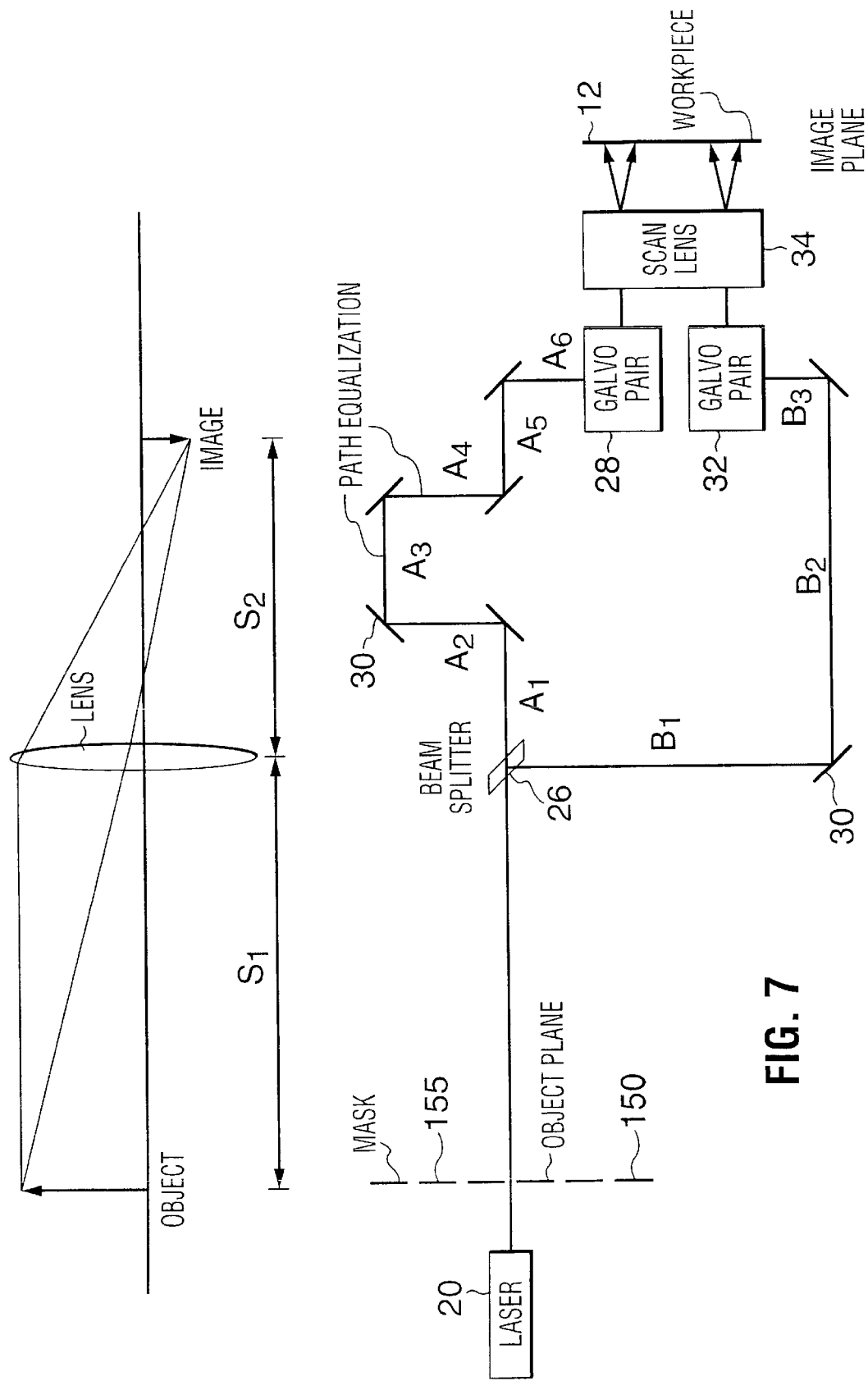
FIG. 7 shows a schematic representation of an imaging mode implementation using path length balancing used as a variation to the focus spot based apparatus shown in FIG. 1.

The description of the machining process in FIGS. 1–6 are termed scanned focused spot machining. FIG. 7 illustrates an example of an imaging mode for machining using path equalization according to an embodiment of the present invention.

For the case of the above described multi-beam optical system 10 and 80 operating in an imaging mode, it is desirable for the image focus and magnification to be equal for all beams. To facilitate this requirement, the path lengths $A_i$ and $B_i$ for each of the beams from an object plane 150 to the scan lens 34 are made equal (i.e.

$$\left(i.e. \sum_{i=1}^{6} A_i = \sum_{i=1}^{3} B_i\right)$$

by the placement of suitable reflective turning mirrors 30 located behind the beam splitter 26 and forward of the scan lens 34. A single object, for example an aperture mask 155, can be used as the object for creating images in multiple beams, resulting in: (a) better beam-to-beam profile uniformity and (b) lower cost object (mask) changing devices.

It is often desirable to make the angle of the beam hitting the workpiece 12 as close to perpendicular as possible in order to create features that are either parallel or perpendicular to the surface of the workpiece 12. Where more than one similar beam is accessing a single process field 38 through a single scan lens 34, the optical design of the lens 34 and the location of the galvanometer mirrors 28, 32 can result in beams that are not perpendicular to the surface of the workpiece 12.

Figure 8A:
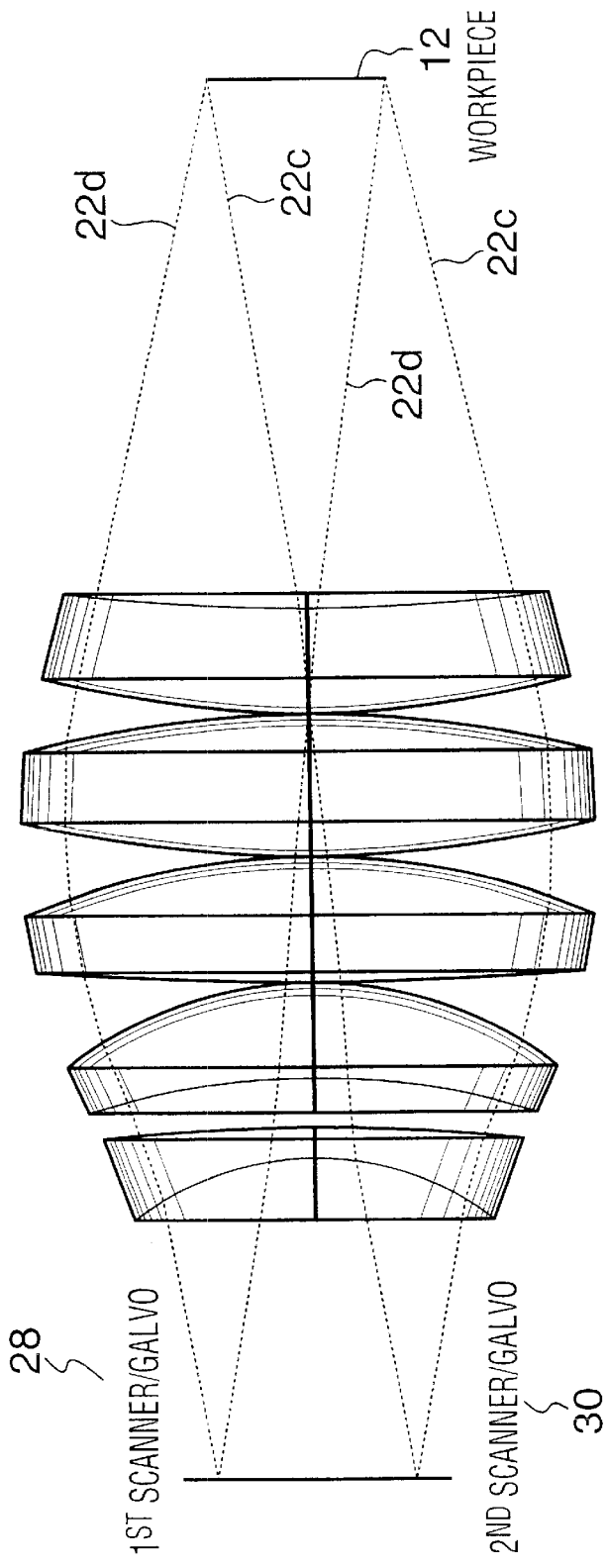
FIG. 8A shows a schematic of a method of using alternating beams from different angles to produce vias in a workpiece.
Figure 8B:
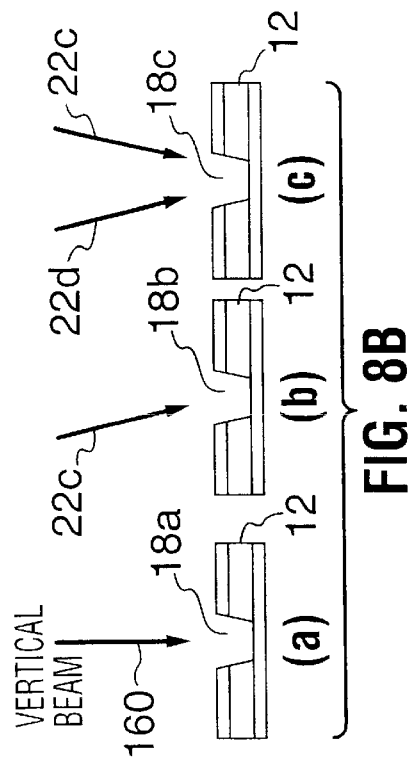
FIG. 8B shows various schematic cross-sections of workpieces (a)–(c) with a via using (a) vertical beams, (b) single angled beam and (c) multiple alternating angle beams.

The geometry of the processed feature can be greatly improved by alternating pulses from beams of complimentary angles as illustrated in FIGS. 8A and 8B. The galvanometers 28, 32 can command the alternating placement of these beams at appropriate intervals during processing of any particular feature.

FIG. 8B(a) illustrates a via 18a drilled using a vertical beam 160. The resulting via 18a is considered "ideal" in shape. FIG. 8B(b) illustrates a via 18b drilled using a single angled beam 22c. The resulting via 18b is slightly undercut as shown by the irregular tapers in the via 18b. FIG. 8B(c) illustrates a via 18c drilled using an alternating arrangement between beams 22c and 22d (i.e. 22c fires, 22d fires, 22c fires, etc.). Refer to FIG. 8A for a detailed view of the paths of the beams 22c, d. The resulting via 18c is similar to the "ideal" shape of via 18a.

For the case of processing of the workpiece 12 that is not flat with respect to the mounting of the scan lens 34, and when the beams 22c,d do not impinge on the surface of the workpiece 12 precisely perpendicular to the surface, positional accuracy of the beam locations on the workpiece 12 are improved by: (a) correcting the distance from the scan lens 34 to the workpiece 12; or (b) compensating by adjusting the galvanometer angular position based on a mapping of a workpiece profile 170 (shown in FIG. 9B).

The later compensation scheme is illustrated in FIG. 9A. In particular, where there is a discrepancy between an actual workpiece height 170 and the nominal workpiece height 172 a light spot 174 of the laser beam is not correctly located on the workpiece. To correct this, the galvo angle position is corrected based on feedback from the control module 40. The adjusted light spot will drill the workpiece 12 in a correct position 176.

In the case where the optical design of a multi-beam scan lens system results in a variation in the angle of the beams across the processing field, it is advantageous to group features to be processed by their location in the field so as to minimize the variation in beam angle from feature to feature. In particular, it is typically advantageous to keep the processing beams at near normal incidence to the workpiece by limiting the extent of their individual processing areas within the field covered by the scan lens, hence improving processing quality.

Furthermore, by keeping the processing beams at near normal incidence to the workpiece, the positional accuracy of the beam on the workpiece is rendered less sensitive to errors caused by the combination of beam angle and surface profile variations. To accomplish this, the control module 40 assigns features to be processed to individual beams operating only within their preferred sub-field. By appropriately sorting the features into sub-groups defined by their coordinate locations within the field, the above benefits can be realized.

To achieve the fastest processing and most efficient use of the laser power available, the control module 40 is designed to simultaneously move the galvanometers and trigger the lasers at appropriate timing intervals. In the parallel control of multiple sets of galvanometers to direct multiple beams, and when using high repetition rate pulsed lasers operating from several hertz into the tens of kilohertz, a significant processing task must be performed by the control module 40. The extent of this task is further expanded when calculations such as dynamic correction for beam position non-linearity and other alignment corrections need to be applied on a pulse by pulse basis.

To achieve parallel processing of multiple features simultaneously and at high speed, a high performance computer processor such as a Digital Signal Processor (DSP) is used to control the galvanometers and lasers. Typical DSP architecture is particularly suited to this application due to the capacity for very high speed execution of parallel commands and calculations. The benefit of this high speed parallel processing is the ability to utilize more available laser power by decreasing calculation overheads and thereby improving the efficiency of the system.

What is claimed is:

1. A material machining apparatus for machining a workpiece, said apparatus comprising:
   supply means for supplying a plurality of discrete machining beams that are separate from each other;
   deflecting devices, one for each of the plurality of discrete machining beams, for deflecting one of the plurality of discrete machining beams to generate multiple independent beams at a plurality of positions within a field of operation on the workpiece;
   a scan lens having an entrance pupil, said entrance pupil being configured to receive the multiple independent beams from the deflecting devices, said deflecting devices being located proximate to the entrance pupil of the scan lens; and
   control means for controlling said deflecting devices to change the respective positions of the multiple independent beams in at least one co-ordinate direction within the field of operation.

2. The apparatus of claim 1, wherein the supply means includes a source laser for supplying a source beam, a polarization modifier configured to receive and process the source beam, a beam splitter configured to receive output from the polarization modifier to generate the discrete machining beams and a turning mirror to direct one of the discrete machining beams to one of the deflecting devices.

3. The apparatus of claim 2, wherein the source laser operates at a wavelength selected from the group consisting of ultraviolet, visible and infrared.

4. The apparatus of claim 2, wherein the polarization modifier is a rotator having a half wave plate.

5. The apparatus of claim 1, wherein each one of the deflecting devices include a pair of galvanometers.

6. The apparatus of claim 5, wherein each galvanometer of the pair of galvanometers includes a mirror mounted to a moving element driven by a drive coil to control the angle of the mirror.

7. The apparatus of claim 1, wherein the scan lens includes a plurality of axially aligned individual lens.

8. The apparatus of claim 1, further comprising a laser dump.

9. The apparatus of claim 8, wherein the laser dump includes a reflector positioned proximate to the field of operation for receiving an unwanted laser beam selected from the multiple independent beams and an absorber for receiving the unwanted laser beam from the reflector.

10. The apparatus of claim 2, further comprising path balancing means to match image focus and magnification for the discrete machining beams.

11. The apparatus of claim 10, wherein the path balancing means includes a plurality of turning mirrors located after the beam splitter wherein a path length ($A_f$) of one of the discrete machining beams and a path length ($B_f$) of another one of the discrete machining beams from an object plane to the scan lens are equal.

12. The apparatus of claim 2, further comprising power balancing means to balance power output of multiple independent beams.

13. The apparatus of claim 12, wherein the power balancing means includes a power meter for measuring the energy of the beams to generate a first and a second power reading and a polarization control module connected to the polarization modifier, said polarization control module receives the power readings from the power meter and modifies the polarization modifier to match the first and second power reading.

14. An apparatus for machining a workpiece using a plurality of material machining apparatuses operating in parallel, each material machining apparatus comprising:
   supply means for supplying a plurality of discrete machining beams;
   deflecting devices, one for each of the plurality of discrete machining beams, for deflecting one of the plurality of discrete machining beams to generate multiple independent beams at a plurality of positions within a field of operation on the workpiece;
   a scan lens having an entrance pupil, said entrance pupil being configured to receive the multiple independent beams from the deflecting devices, said deflecting devices being located proximate to the entrance pupil of the scan lens; and
   control means for controlling said deflecting devices to change the respective positions of the multiple independent beams in at least one co-ordinate direction within the field of operation.

15. The apparatus of claim 14, wherein each one of the deflecting devices include a pair of galvanometers.

16. The apparatus of claim 15, wherein each galvanometer of the pair of galvanometers includes a mirror mounted to a moving element driven by a drive coil to control the angle of the mirror.

17. The apparatus of claim 14, further comprising path balancing means to match image focus and magnification for the discrete machining beams.

18. The apparatus of claim 17, wherein the path balancing means includes a plurality of turning mirrors located after the beam splitter wherein a path length ($A_I$) of one of the discrete machining beams and a path length ($B_I$) of another one of the discrete machining beams from an object plane to the scan lens are equal.

19. The apparatus of claim 14, further comprising power balancing means to balance power output of multiple independent beams.

20. The apparatus of claim 19, wherein the power balancing means includes a power meter for measuring the energy of the beams to generate a first and a second power reading and a polarization control module connected to a polarization modifier, said polarization control module receives the power readings from the power meter and modifies the polarization modifier to match the first and second power reading.

21. A method of machining a workpiece using a laser comprising the steps of:
(a) generating from the laser a plurality of discrete machining beams;
(b) deflecting each one of the plurality of discrete machining beams to generate multiple independent beams at a plurality of positions within a field of operation on the workpiece;
(c) receiving the multiple independent beams produced by the deflecting step at an entrance pupil of a scan lens; and
(d) controlling said deflecting step to change the respective positions of the multiple independent beams in at least one co-ordinate direction within the field of operation.

22. The method of claim 21, further comprising compensating for workpiece irregularities by changing the distance between the scan lens and the workpiece.

23. The method of claim 21, further comprising compensating for workpiece irregularities by adjusting the angular position of the beams of the scan lens.

24. A material machining apparatus for machining a workpiece, said apparatus comprising:
a system for generating a plurality of discrete machining beams;
a plurality of deflecting devices, each deflecting device deflecting a respective one of the plurality of discrete machining beams to generate multiple independent beams at a plurality of positions within a field of operation on the workpiece;
a scan lens having an entrance pupil, the entrance pupil being configured to receive the multiple independent beams from the deflecting devices; and
a controller for controlling the deflecting devices to change the respective positions of the multiple independent beams in at least one co-ordinate direction within the field of operation.

25. The apparatus of claim 24, wherein the generating system includes a source laser for supplying a source beam, a polarization modifier configured to receive and process the source beam, a beam splitter configured to receive output from the polarization modifier to generate the discrete machining beams and a turning mirror to direct each discrete machining beam to a respective one of the deflecting devices.

26. The apparatus of claim 25, wherein the source laser operates at a wavelength selected from the group consisting of ultraviolet, visible and infrared.

27. The apparatus of claim 22, wherein the polarization modifier is a rotator having a half wave plate.

28. The apparatus of claim 24, wherein each deflecting device include a pair of galvanometers.

29. The apparatus of claim 28, wherein each galvanometer of each pair of galvanometers includes a mirror mounted to a moving element driven by a drive coil to control the angle of the mirror.

30. The apparatus of claim 24, wherein the scan lens includes a plurality of axially aligned lenses.

31. The apparatus of claim 24, further comprising a laser dump.

32. The apparatus of claim 31, wherein the laser dump includes a reflector positioned proximate to the field of operation for receiving an unwanted laser beam selected from the multiple independent beams and an absorber for receiving the unwanted laser beam from the reflector.

33. The apparatus of claim 25, further comprising a path balancer to match image focus and magnification for the discrete machining beams.

34. The apparatus of claim 33, wherein the path balancer includes a plurality of turning mirrors located after the beam splitter wherein a path length ($A_I$) of one of the discrete machining beams and a path length ($B_I$) of another one of the discrete machining beams from an object plane to the scan lens are equal.

35. The apparatus of claim 25, further comprising a power balancer to balance power output of multiple independent beams.

36. The apparatus of claim 35, wherein the power balancer includes a power meter for measuring the energy of the multiple independent beams to generate a first and a second power reading and a polarization control module connected to the polarization modifier, said polarization control module receiving the power readings from the power meter and modifying the polarization modifier to match the first and second power reading.

* * * * *